US012624940B2

(12) United States Patent
Jin et al.

(10) Patent No.: US 12,624,940 B2
(45) Date of Patent: May 12, 2026

(54) ILLUMINATION SOURCE AND ASSOCIATED METROLOGY APPARATUS

(71) Applicant: ASML Netherlands B.V., Veldhoven (NL)

(72) Inventors: Wenjie Jin, Eindhoven (NL); Petrus Wilhelmus Smorenburg, Veldhoven (NL); Nan Lin, Eindhoven (NL); Christina Lynn Porter, Veldhoven (NL); David O'Dwyer, Eindhoven (NL); Cord Louis Arnold, Rydebäck (SE); Sjoerd Nicolaas Lambertus Donders, Vught (NL)

(73) Assignee: ASML Netherlands B. V., Veldhoven (NL)

( * ) Notice: Subject to any disclaimer, the term of this patent is extended or adjusted under 35 U.S.C. 154(b) by 413 days.

(21) Appl. No.: 18/017,178

(22) PCT Filed: Jun. 14, 2021

(86) PCT No.: PCT/EP2021/065985
§ 371 (c)(1),
(2) Date: Jan. 20, 2023

(87) PCT Pub. No.: WO2022/017687
PCT Pub. Date: Jan. 27, 2022

(65) Prior Publication Data
US 2023/0288818 A1      Sep. 14, 2023

(30) Foreign Application Priority Data

| | | |
|---|---|---|
| Jul. 21, 2020 | (EP) | ..................................... 20187019 |
| Aug. 26, 2020 | (EP) | ..................................... 20192841 |
| Apr. 19, 2021 | (EP) | ..................................... 21169180 |

(51) Int. Cl.
| | |
|---|---|
| *G01B 9/02001* | (2022.01) |
| *G03F 7/00* | (2006.01) |
| *H05G 2/00* | (2006.01) |

(52) U.S. Cl.
CPC ..... *G01B 9/02001* (2013.01); *G03F 7/70008* (2013.01); *G03F 7/70641* (2013.01); *H05G 2/0027* (2024.08)

(58) Field of Classification Search
CPC ............ G01B 9/02001; G01B 9/02067; G03F 7/70033; H05G 2/003; H05G 2/006; H05G 2/0027; H01S 3/0092
See application file for complete search history.

(56) References Cited

U.S. PATENT DOCUMENTS

| | | |
|---|---|---|
| 6,952,253 B2 | 10/2005 | Lof et al. |
| 7,701,577 B2 | 4/2010 | Straaijer et al. |
| | (Continued) | |

FOREIGN PATENT DOCUMENTS

| | | |
|---|---|---|
| CN | 101515105 B | 7/2010 |
| EP | 1 628 164 A2 | 2/2006 |
| | (Continued) | |

OTHER PUBLICATIONS

Eichmann, H. et al. "Generation of short-pulse tunable xuv radiation by high-order frequency mixing". Physical Review A, vol. 50, No. 4, Oct. 1994, pp. R2834-2836. (Year: 1994).*
(Continued)

*Primary Examiner* — Michael A Lyons
(74) *Attorney, Agent, or Firm* — Finnegan, Henderson, Farabow, Garrett & Dunner LLP

(57) ABSTRACT
Disclosed is an illumination source comprising a gas delivery system being configured to provide a gas target for generating an emitted radiation at an interaction region of the gas target, and an interferometer for illuminating at least
(Continued)

part of the gas target with an interferometer radiation to measure a property of the gas target.

18 Claims, 7 Drawing Sheets

(56)                    References Cited

U.S. PATENT DOCUMENTS

| | | | |
|---|---|---|---|
| 7,791,724 B2 | 9/2010 | Den Boef et al. | |
| 8,115,926 B2 | 2/2012 | Straaijer | |
| 8,553,227 B2 | 10/2013 | Jordanoska | |
| 8,681,312 B2 | 3/2014 | Straaijer | |
| 8,692,994 B2 | 4/2014 | Straaijer | |
| 8,792,096 B2 | 7/2014 | Straaijer | |
| 8,797,554 B2 | 8/2014 | Straaijer | |
| 8,823,922 B2 | 9/2014 | Den Boef | |
| 2006/0066855 A1 | 3/2006 | Boef et al. | |
| 2007/0224518 A1 | 9/2007 | Yokhin et al. | |
| 2008/0237498 A1 | 10/2008 | MacFarlane | |
| 2010/0328655 A1 | 12/2010 | Den Boef | |
| 2011/0026032 A1 | 2/2011 | Den Boef et al. | |
| 2011/0102753 A1 | 5/2011 | Van De Kerkhof et al. | |
| 2011/0249244 A1 | 10/2011 | Leewis et al. | |
| 2012/0044470 A1 | 2/2012 | Smilde et al. | |
| 2013/0119232 A1 | 5/2013 | Moriya et al. | |
| 2013/0162996 A1 | 6/2013 | Straaijer et al. | |
| 2013/0304424 A1 | 11/2013 | Bakeman et al. | |
| 2014/0019097 A1 | 1/2014 | Bakeman et al. | |
| 2016/0161863 A1 | 6/2016 | Den Boef et al. | |
| 2016/0282282 A1 | 9/2016 | Quintanilha et al. | |
| 2016/0370717 A1 | 12/2016 | Den Boef et al. | |
| 2017/0184981 A1 | 6/2017 | Quintanilha et al. | |
| 2018/0254597 A1* | 9/2018 | Van Der Post | H05G 2/002 |
| 2018/0267411 A1* | 9/2018 | Srivastava | G01N 21/8806 |

FOREIGN PATENT DOCUMENTS

| | | | | |
|---|---|---|---|---|
| EP | 3276419 A1 | 1/2018 | | |
| JP | 2019-529953 A | * 10/2019 | | |
| NL | 2024462 A | 1/2020 | | |
| WO | WO 2011/012624 A1 | 2/2011 | | |
| WO | WO 2019/219336 A1 | 11/2019 | | |
| WO | WO 2020/038648 A1 | 2/2020 | | |
| WO | WO-2020114684 A1 * | 6/2020 | ......... | G03F 7/70525 |

OTHER PUBLICATIONS

International Search Report and Written Opinion of the International Searching Authority directed to International Patent Application No. PCT/EP2021/065985, mailed Sep. 16, 2021; 9 pages.

Dahlstrom et al., "Interference effects in two-color high-order harmonic generation," Physical review A, Atomic, molecular, and optical physics, vol. 82, No. 3, Sep. 2010; pp. 1-4.

Fiedorowicz et al., "X-ray laser experiments using laser-irradiated gas puff targets at the ASTERIX IV facility," Proc. SPIE, vol. 2520, Soft X-Ray Lasers and Applications, Sep. 25, 1995; pp. 55-68.

Hergott et al., "XUV interferometry using high-order harmonics: Application to plasma diagnostics," Laser and Particle Beams, vol. 19, Feb. 5, 2001; pp. 35-40.

Jansen et al., "Spatially Resolved Fourier Transform Spectroscopy in the Extreme Ultraviolet," Optica, vol. 3, No. 10, Jul. 8, 2016; pp. 1-10.

Lemaillet et al., "Intercomparison between optical and x-ray scatterometry measurements of FinFET structures," Proc. SPIE, vol. 8681, Metrology, Inspection, and Process Control for Microlithography XXVII, Apr. 10, 2013; 8 pages.

Takeda et al., "Fourier-transform method of fringe-pattern analysis for computer-based topography and interferometry," Journal of the Optical Society of America, vol. 72, No. 1, Jan. 1982; pp. 156-160.

Tross et al., "Self referencing attosecond interferometer with zeptosecond precision," Optics Express, vol. 27, No. 16, Aug. 5, 2019; pp. 22960-22969.

Chinese Office Action direct to Chinese Patent Application No. 202180060240.9, mailed Sep. 30, 2025; 9 pages.

\* cited by examiner (a)                    (b)                    (c)

ILLUMINATION SOURCE AND ASSOCIATED METROLOGY APPARATUS

CROSS REFERENCE TO RELATED APPLICATIONS

This application claims priority of EP application 20187019.3 which was filed on 2020 Jul. 21 and EP application 20192841.3 which was filed on 2020 Aug. 26 and EP application 21169180.3 which was filed on 2021 Apr. 19 and whom are incorporated herein in their entirety by reference.

FIELD

The present invention relates to illumination source, metrology apparatus and a method of inspecting a gas target of an illumination source.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda / NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field.

Examples of known scatterometers often rely on provision of dedicated metrology targets. For example, a method may require a target in the form of a simple grating that is large enough that a measurement beam generates a spot that is smaller than the grating (i.e., the grating is underfilled). In so-called reconstruction methods, properties of the grating can be calculated by simulating interaction of scattered radiation with a mathematical model of the target structure. Parameters of the model are adjusted until the simulated interaction produces a diffraction pattern similar to that observed from the real target.

In addition to measurement of feature shapes by reconstruction, diffraction-based overlay can be measured using such apparatus, as described in published patent application US2006066855A1. Diffraction-based overlay metrology using dark-field imaging of the diffraction orders enables overlay measurements on smaller targets. These targets can be smaller than the illumination spot and may be surrounded by product structures on a wafer. Examples of dark field imaging metrology can be found in numerous published patent applications, such as for example US2011102753A1 and US20120044470A. Multiple gratings can be measured in one image, using a composite grating target. The known scatterometers tend to use light in the visible or near-infrared (IR) wave range, which requires the pitch of the grating to be much coarser than the actual product structures whose properties are actually of interest. Such product features may be defined using deep ultraviolet (DUV), extreme ultraviolet (EUV) or X-ray radiation having far shorter wavelengths. Unfortunately, such wavelengths are not normally available or usable for metrology.

On the other hand, the dimensions of modern product structures are so small that they cannot be imaged by optical metrology techniques. Small features include for example those formed by multiple patterning processes, and/or pitch-multiplication. Hence, targets used for high-volume metrology often use features that are much larger than the products whose overlay errors or critical dimensions are the property of interest. The measurement results are only indirectly related to the dimensions of the real product structures, and may be inaccurate because the metrology target does not suffer the same distortions under optical projection in the lithographic apparatus, and/or different processing in other steps of the manufacturing process. While scanning electron microscopy (SEM) is able to resolve these modern product structures directly, SEM is much more time consuming than optical measurements. Moreover, electrons are not able to penetrate through thick process layers, which makes them less suitable for metrology applications. Other techniques, such as measuring electrical properties using contact pads is also known, but it provides only indirect evidence of the true product structure.

By decreasing the wavelength of the radiation used during metrology, it is possible to resolve smaller structures, to increase sensitivity to structural variations of the structures and/or penetrate further into the product structures. One such method of generating suitably high frequency radiation (e.g. hard X-ray, soft X-ray and/or EUV radiation) may be using a pump radiation (e.g., infra-red radiation) to excite a generating medium, thereby generating an emitted radiation, optionally a high harmonic generation comprising high frequency radiation.

SUMMARY

According to a first aspect of the disclosure, there is provided an illumination source comprising a gas delivery system being configured to provide a gas target for generating an emitted radiation at an interaction region of the gas target, and an interferometer for illuminating at least part of the gas target with an interferometer radiation to measure a property of the gas target.

Optionally, the illumination source being configured to receive a pump radiation and to provide the pump radiation at the interactive region.

Optionally, the interferometer radiation has an interferometer wavelength, and the pump radiation has a pump wavelength, wherein the interferometer wavelength and the pump wavelength are different.

Optionally, the interferometer radiation and the pump radiation comprise pulses.

Optionally, the pulses of the interferometer radiation and the pump radiation are at least partly synchronized.

Optionally, the interferometer radiation is a second or higher harmonic of an interferometer pump radiation generated by a harmonic generation process.

Optionally, the interferometer radiation is a second or third harmonic of the interferometer pump radiation generated by the harmonic generation process.

Optionally, the interferometer pump radiation and the pump radiation are split from a radiation source.

Optionally, the illumination source comprises a reflective surface with a pinhole for splitting the interferometer pump radiation and the pump radiation.

Optionally, in operation the interferometer pump radiation passes through the pinhole and the pump radiation is reflected by the reflective surface.

Optionally, power of the interferometer pump radiation is at least one order lower than power of the pump radiation.

Optionally, the illumination source comprises a time delay unit for adjusting a time delay between the pulses of the interferometer radiation and the pump radiation.

Optionally, the illumination source comprises a feedback loop or a feedforward loop based on a property of the gas target.

Optionally, the illumination source comprises a feedback loop to control a property of the pump radiation or the gas delivery system based on the property of the gas target.

Optionally, the interferometer comprises two branches with a first branch radiation at least partly passing through the gas target and a second branch radiation not passing through the gas target, wherein the first branch radiation and the second branch radiation interfere.

Optionally, the gas delivery system comprises a gas nozzle and the interferometer radiation at least partly illuminates on at least part of the gas nozzle.

Optionally, the interferometer comprises an adjustable element for altering a propagation direction of the interferometer radiation.

Optionally, the illumination source comprises a space that is configured to be evacuated and the gas delivery system is configured to provide the gas target in the space.

Optionally, the emitted radiation has a wavelength in X-ray or EUV range, wherein optionally the wavelength is in a range from 0.01 nm to 100 nm, optionally from 0.1 nm to 100 nm, optionally from 1 nm to 100 nm, optionally from 1 nm to 50 nm, or optionally from 10 nm to 20 nm.

According to another aspect of the disclosure there is provided a metrology apparatus comprising an illumination source as set out above.

Optionally, in operation the emitted radiation is guided to a structure on a substrate.

According to another aspect of the disclosure there is provided a lithographic cell comprising an illumination source or comprising a metrology apparatus as set out above.

According to another aspect of the disclosure there is provided a method of inspecting a gas target of an illumination source comprising providing a gas target with a gas delivery system for generating an emitted radiation at an interaction region of the gas target, and illuminating at least part of the gas target using an interferometer radiation of an interferometer to measure a property of the gas target.

According to another aspect of the disclosure there is provided a method of aligning a pump radiation with respect to a gas target comprising the steps of providing the gas target with a gas delivery system, illuminating at least part of the gas target with an interferometer radiation of an interferometer to measure a property of the gas target, illuminating at least part of the gas target with a pump radiation, and controlling a property of at least one of the gas delivery system and the pump radiation based on a property of the gas target measured by the interferometer.

According to another aspect of the disclosure there is provided a method of optimizing an emitted radiation output comprising the steps of providing a gas target with a gas delivery system, illuminating at least part of the gas target with an interferometer radiation of an interferometer to measure a property of the gas target, illuminating at least part of the gas target with a pump radiation, and controlling a property of at least one of the gas delivery system and the pump radiation based on a property of the gas target measured by the interferometer.

According to another aspect of the disclosure there is provided a method of monitoring a plasma evolution over time comprising the steps of providing a gas target with a gas delivery system, illuminating at least part of the gas target with an interferometer radiation of an interferometer to measure a property of the gas target, illuminating at least part of the gas target with a pump radiation to initiate the plasma evolution in the gas target, and monitoring the plasma evolution over time based on a property of the gas target measured by the interferometer.

BRIEF DESCRIPTION OF THE DRAWINGS

Embodiments will now be described, by way of example only, with reference to the accompanying schematic drawings, in which.

DETAILED DESCRIPTION

In the present document, the terms "radiation" and "beam" are used to encompass all types of electromagnetic radiation and particle radiation, including ultraviolet radiation (e.g. with a wavelength of 365, 248, 193, 157 or 126 nm), EUV (extreme ultra-violet radiation, e.g. having a wavelength in the range of about 5-100 nm), X-ray radiation, electron beam radiation and other particle radiation.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
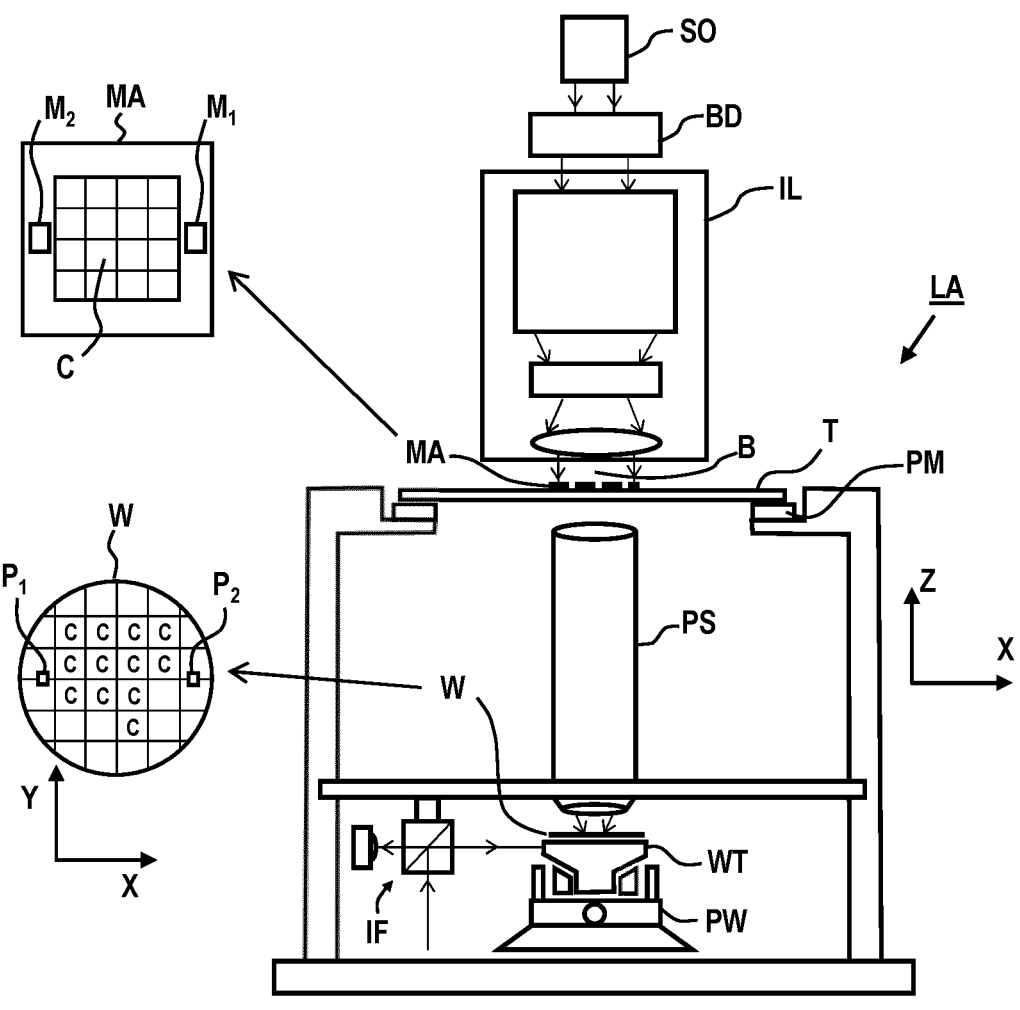
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation, EUV radiation or X-ray radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, diffractive, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, diffractive, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference in its entirety.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT may be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
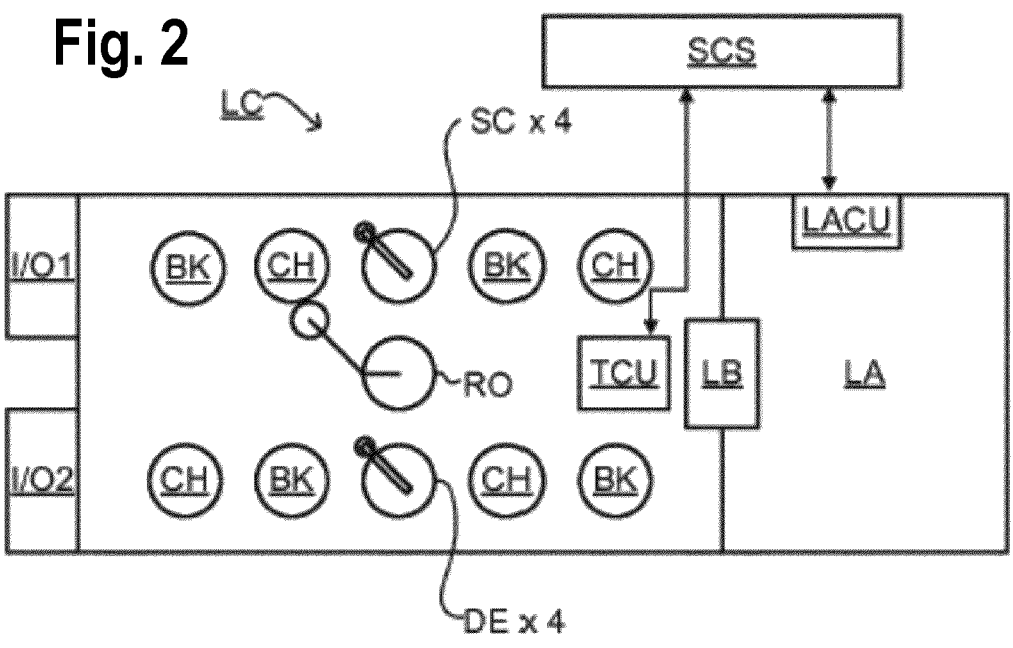
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, may be under the control of a track control unit TCU that in itself may be controlled by a supervisory control system SCS, which may also control the lithographic apparatus LA, e.g. via lithography control unit LACU.

In lithographic processes, it is desirable to make frequently measurements of the structures created, e.g., for process control and verification. Tools to make such measurement may be called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in an image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from hard X-ray, soft X-ray, extreme ultraviolet and visible to near-IR wavelength range. In case that the radiation is hard X-ray or soft X-ray, optionally with a wavelength ranging from 0.01 to 10 nm, the aforementioned scatterometers may optionally be a small-angle X-ray scattering metrology tool.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), shape of structures, etc. For this purpose, inspection tools and/or metrology tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected, transmitted or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered or transmitted radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920, 968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (may be overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. The pitch and line-width of the structures in the gratings may strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Figure 3:
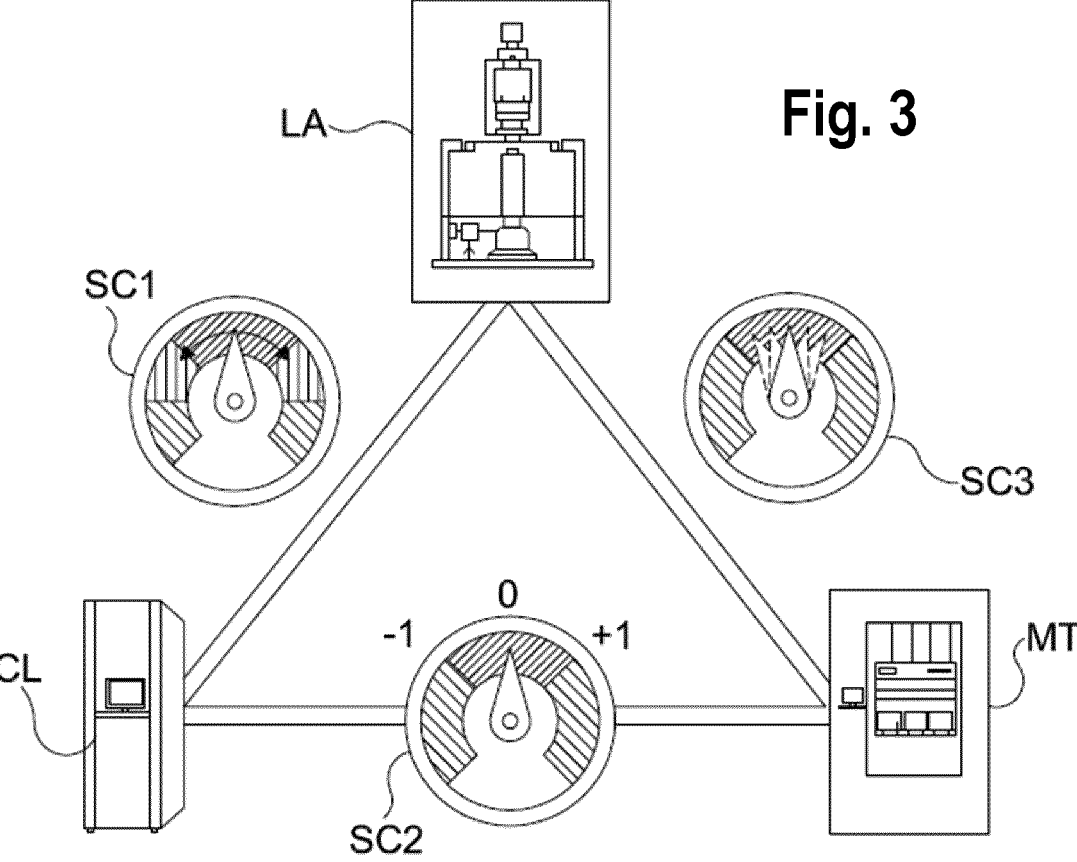
FIG. 3 depicts a schematic representation of holistic lithography, representing a cooperation between three key technologies to optimize semiconductor manufacturing.

The patterning process in a lithographic apparatus LA may be one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—may be within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). The resolution enhancement techniques may be arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating may be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in or close to the pupil plane or a conjugate plane with the pupil of the objective of the scatterometer, measurements usually referred as pupil based measurements, or by having the sensor in or close to the image plane or a plane conjugate with the image plane, in which case the measurements are usually referred as image or field based measurements. Such scatterometers and the associated measurement techniques are further described in patent applications US20100328655, US2011102753A1, US20120044470A, 0520110249244, 0520110026032 or EP1,628,164A, incorporated herein by reference in their entirety. Aforementioned scatterometers may measure in one image multiple targets from multiple gratings using light from hard X-ray, soft X-ray, extreme ultraviolet, visible to near-IR and IR wave range.

Figure 4:
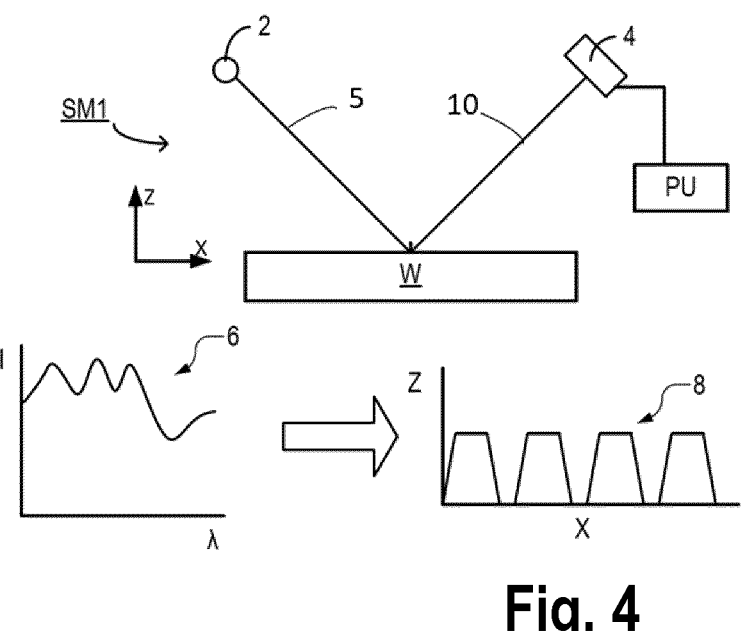
FIG. 4 schematically illustrates a scatterometry apparatus.

One example of a metrology apparatus, such as a scatterometer, is depicted in FIG. 4. It may comprise a broadband (e.g. white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength of the specular reflected radiation.

From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

As an alternative to optical metrology methods, it has also been considered to use hard X-ray, soft X-rays or EUV radiation, for example radiation in a wavelength range between 0.01 nm and 100 nm, or optionally between 1 nm and 50 nm or optionally between 10 nm and 20 nm. Reflectometry techniques using X-rays (GI-XRS) and extreme ultraviolet (EUV) radiation at grazing incidence may be used for measuring properties of films and stacks of layers on a substrate. Within the general field of reflectometry, goniometric and/or spectroscopic techniques may be applied. In goniometry, the variation of a reflected beam with different incidence angles may be measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

Figure 5:
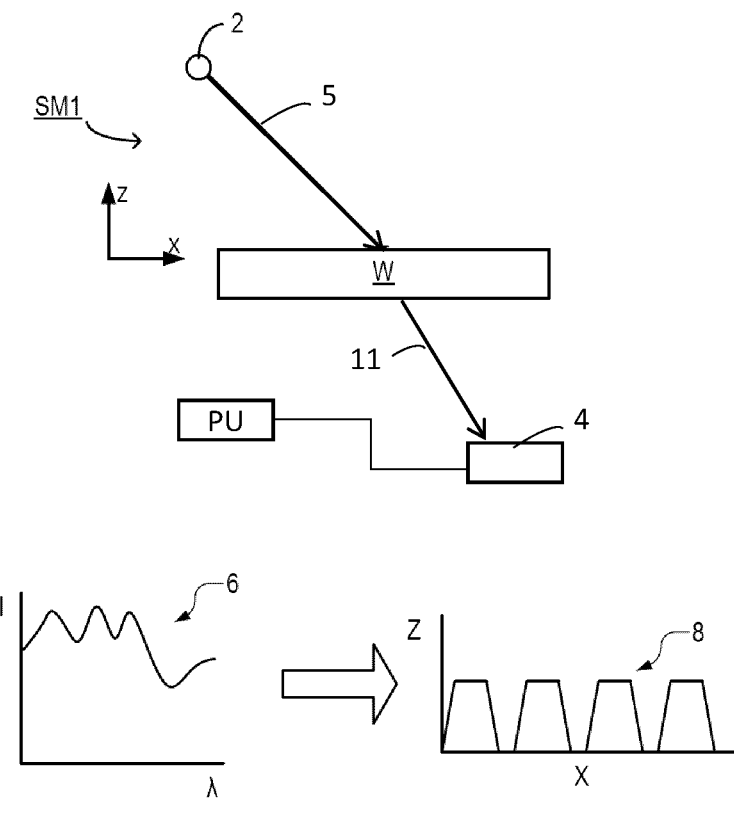
FIG. 5 schematically illustrates a transmissive scatterometry apparatus.

A transmissive version of the example of a metrology apparatus, such as a scatterometer shown in FIG. 4, is depicted in FIG. 5. The transmitted radiation 11 is passed to a spectrometer detector 4, which measures a spectrum 6 as discussed for FIG. 4. Such a scatterometer may be configured as a normal-incidence scatterometer or an oblique-incidence scatterometer.

It is possible that the range of application makes the use of wavelengths in e.g. the soft X-rays or EUV domain not sufficient. One example of metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. Published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common. The contents of the cited US patent applications are incorporated herein by reference in their entirety.

Figure 6:
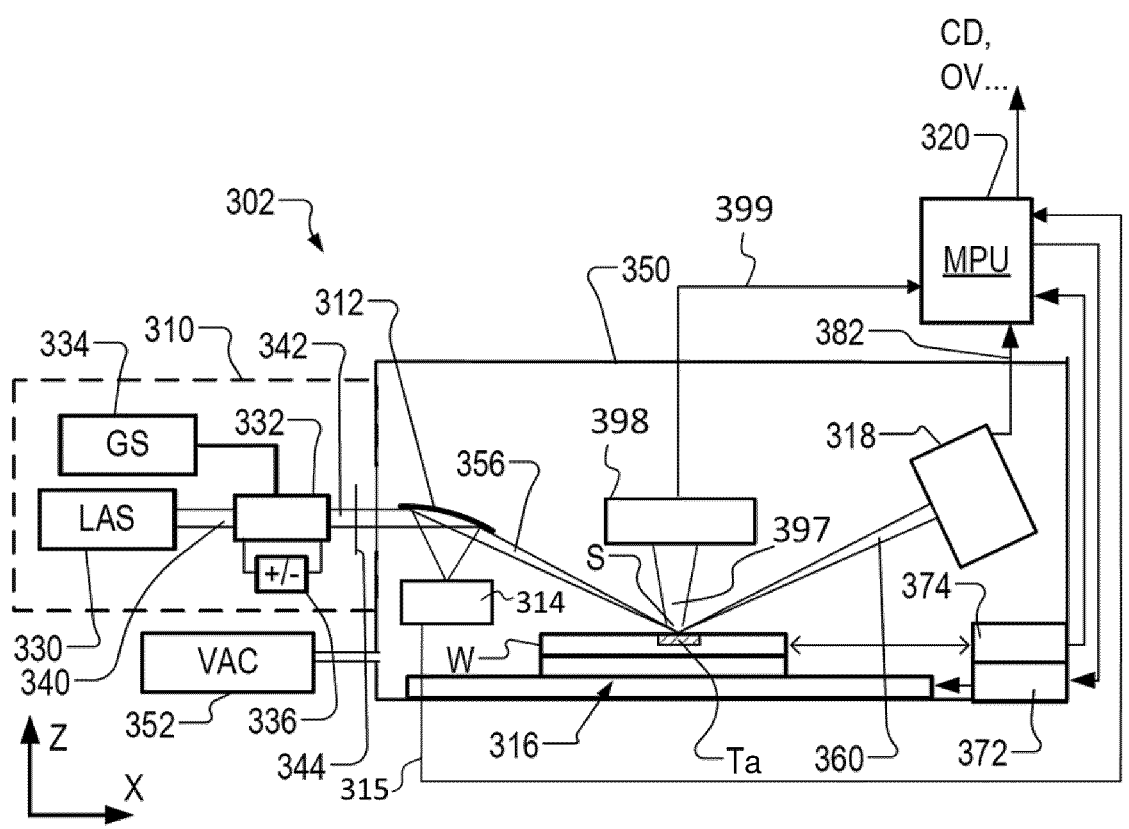
FIG. 6 depicts a schematic representation of a metrology apparatus in which EUV and/or SXR radiation is used.

FIG. 6 depicts a schematic representation of a metrology apparatus 302 in which radiation in the wavelength range from 0.01 nm to 100 nm may be used to measure parameters of structures on a substrate. The metrology apparatus 302 presented in FIG. 6 may be suitable for the hard X-ray, soft X-rays or EUV domain.

FIG. 6 illustrates a schematic physical arrangement of a metrology apparatus 302 comprising a spectroscopic scatterometer using hard X-ray (HXR) and/or Soft X-Ray (SXR) and/or EUV radiation optionally in grazing incidence, purely by way of example. An alternative form of inspection apparatus might be provided in the form of an angle-resolved scatterometer, which may use radiation in normal or near-normal incidence similar to the conventional scatterometers operating at longer wavelengths. An alternative form of inspection apparatus might be provided in the form of a transmissive scatterometer, to which the configuration in FIG. 5 applies.

Inspection apparatus 302 comprises a radiation source or called illumination source 310, illumination system 312, substrate support 316, detection systems 318, 398 and metrology processing unit (MPU) 320.

An illumination source 310 in this example is for a generation of EUV, hard X-ray or soft X-ray radiation. The illumination source 310 may be based on high harmonic generation (HHG) techniques as shown in FIG. 6, and it may also be other types of illumination sources, e.g. liquid metal jet source, inverse Compton scattering (ICS) source, plasma channel source, magnetic undulator source or free electron laser (FEL) source.

For the example of HHG source, as shown in FIG. 6, main components of the radiation source are a pump radiation source 330 operable to emit the pump radiation and a gas delivery system 332. Optionally the pump radiation source 330 is a laser, optionally the pump radiation source 330 is a pulsed high-power infrared or optical laser. The pump radiation source 330 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). Optionally, the laser pulses are delivered as a first pump radiation 340 to the gas delivery system 332, where in the gas a portion of the radiation is converted to higher frequencies than the first radiation into an emitted radiation 342. A gas supply 334 supplies a suitable gas to the gas delivery system 332, where it is optionally ionized by an electric source 336. The gas delivery system 332 may be a cut tube. A gas provided by the gas delivery system 332 defines a gas target, which may be a gas flow or a static volume. The gas may be provided inside a structure, such as a capillary or fiber structure, for interacting with the pump radiation and for generating higher frequency radiation to be emitted. The gas may be for example a noble gas such as Neon (Ne), Helium (He) or Argon (Ar). Nitrogen ($N_2$), oxygen ($O_2$), Argon (Ar), Krypton (Kr), Xenon (Xe) gases may all be considered. These may be selectable options within the same apparatus.

The emitted radiation may contain multiple wavelengths. If the emitted radiation were monochromatic, then measurement calculations (for example reconstruction) may be simplified, but it is easier to produce radiation with several wavelengths. An emission divergence angle of the emitted radiation may be wavelength dependent. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) or Zirconium (Zr) may serve to cut the fundamental IR radiation from passing further into the inspection apparatus. A grating (not shown) may be provided to select one or more specific wavelengths from among those generated. Optionally the illumination source comprises a space that is configured to be evacuated and the gas delivery system is configured to provide a gas target in the space. Optionally some or all of the beam path may be contained within a vacuum environment, bearing in mind that SXR and/or EUV radiation is absorbed when traveling in air. The various components of radiation source 310 and illumination optics 312 may be adjustable to implement different metrology 'recipes' within the same apparatus. For example different wavelengths and/or polarization may be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 0.01-20 nm or optionally in the range 1-10 nm or optionally in the range 10-20 nm may be chosen. Wavelengths shorter than 5 nm may suffer from very low critical angle when reflecting off materials of interest in semiconductor manufacture. Therefore to choose a wavelength greater than 5 nm may provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labeled T. Optionally the atmosphere within inspection chamber 350 may be maintained near vacuum by vacuum pump 352, so that SXR and/or EUV radiation may pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. The focusing is performed to achieve a round or elliptical spot S under 10 μm in diameter, when projected onto the structure of interest. Substrate support 316 comprises for example an X-Y translation stage and a rotation stage, by which any part of the substrate W may be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 320 and the filter may comprise information about the spectrum of the filtered beam 342 and/or the intensities of the different wavelengths in the filtered beam.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise a hard X-ray, soft X-ray and/or EUV spectroscopic reflectometer of the kind described in US2016282282A1 which content is incorporated herein by reference in its entirety.

If the target Ta has a certain periodicity, the radiation of the focused beam 356 may be partially diffracted as well. The diffracted radiation 397 follows another path at well-defined angles with respect to the angle of incidence then the reflected radiation 360. In FIG. 6, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 6 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the target Ta are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 may also communicate with a position controller 372 which operates the translation stage, rotation and/or tilting stages. Processor 320 receives highly accurate feedback on the position and orientation of the substrate, via sensors. Sensors 374 may include interferometers, for example, which may give accuracy in the region of picometers. In the operation of the inspection apparatus 302, spectrum data 382 captured by detection system 318 is delivered to metrology processing unit 320.

As mentioned an alternative form of inspection apparatus uses hard X-ray, soft X-ray and/or EUV radiation optionally at normal incidence or near-normal incidence, for example to perform diffraction-based measurements of asymmetry. Both types of inspection apparatus could be provided in a hybrid metrology system. Performance parameters to be measured may include overlay (OVL), critical dimension (CD), focus of the lithography apparatus while the lithography apparatus printed the target structure, coherent diffraction imaging (CDI) and at-resolution overlay (ARO) metrology. The hard X-ray, soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 may be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

Metrology tools MT, including but not limited to the scatterometers mentioned above, may use radiation from a radiation source to perform a measurement. The radiation used by a metrology tool MT may be electromagnetic radiation. The radiation may be optical radiation, for example radiation in the infrared, visible, and/or ultraviolet parts of the electromagnetic spectrum. Metrology tools MT may use radiation to measure or inspect properties and aspects of a substrate, for example a lithographically exposed pattern on a semiconductor substrate. The type and quality of the measurement may depend on several properties of the radiation used by the metrology tool MT. For example, the resolution of an electromagnetic measurement may depend on the wavelength of the radiation, with smaller wavelengths able to measure smaller features, e.g. due to the diffraction limit. In order to measure features with small dimensions, it may be preferable to use radiation with a short wavelength, for example EUV, hard X-ray (HXR) and/or Soft X-Ray (SXR) radiation, to perform measurements. In order to perform metrology at a particular wavelength or wavelength range, the metrology tool MT requires access to a source providing radiation at that/those wavelength(s). Different types of sources exist for providing different wavelengths of radiation. Depending on the wavelength(s) provided by a source, different types of radiation generation methods may be used. For extreme ultraviolet (EUV) radiation (e.g. 1 nm to 100 nm), and/or soft X-ray (SXR) radiation (e.g. 0.1 nm to 10 nm), a source may use High Harmonic Generation (HHG) or inverse Compton scattering (ICS) to obtain radiation at the desired wavelength(s).

Figure 7:
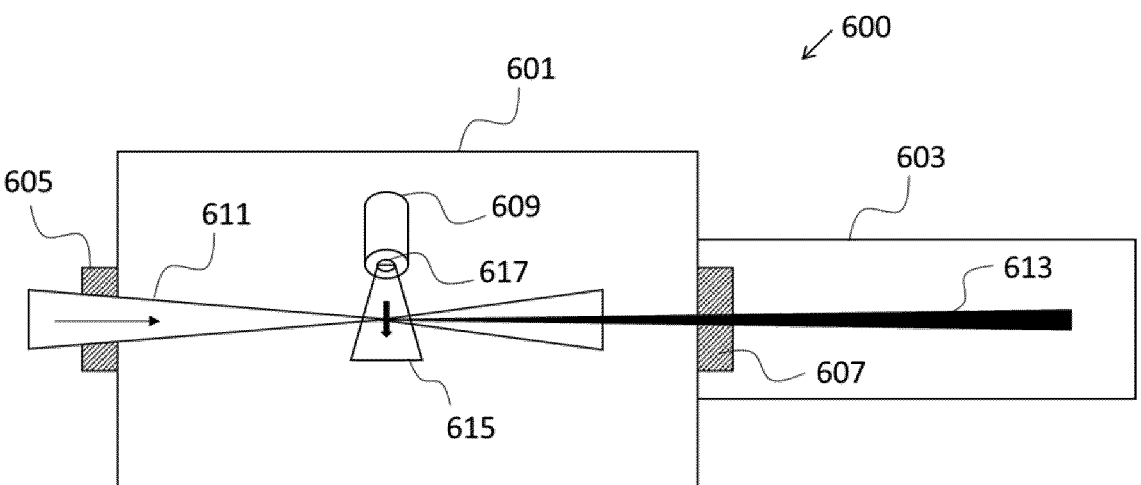
FIG. 7 depicts a simplified schematic drawing of an illumination source.

FIG. 7 shows a simplified schematic drawing of an embodiment 600 of an illumination source 310, which may be the illumination source for high harmonic generation (HHG). One or more of the features of the illumination source in the metrology tool described with respect to FIG. 6 may also be present in the illumination source 600 as appropriate. The illumination source 600 comprises a chamber 601 and is configured to receive a pump radiation 611 with a propagation direction which is indicated by an arrow. The pump radiation 611 shown here is an example of the pump radiation 340 from the pump radiation source 330, as shown in FIG. 6. The pump radiation 611 may be directed into the chamber 601 through the radiation input 605, which may be a viewport, optionally made of fused silica or a comparable material. The pump radiation 611 may have a Gaussian or hollow, for example annular, transversal cross-sectional profile and may be incident, optionally focused, on a gas flow 615, which has a flow direction indicated by a second arrow, within the chamber 601. The gas flow 615 comprises a small volume called gas volume or gas target (for example several cubic mm) of a particular gas (e.g., a noble gas, optionally Helium, Argon, Xenon, or Neon, nitrogen, oxygen or carbon dioxide) in which the gas pressure is above a certain value. The gas flow 615 may be a steady flow. Other media, such as metallic plasmas (e.g. aluminium plasma) may also be used.

The gas delivery system of the illumination source 600 is configured to provide the gas flow 615. The illumination source 600 is configured to provide the pump radiation 611 in the gas flow 615 to drive the generation of emitted radiation 613. The region where at least a majority of the emitted radiation 613 is generated is called an interaction region. The interaction region may vary from several tens of micrometers (for tightly focused pump radiation) to several mm or cm (for moderately focused pump radiation) or even up to a few meters (for extremely loosely focused pump radiation). The gas delivery system is configured to provide the gas target for generating the emitted radiation at the interaction region of the gas target, and optionally the illumination source is configured to receive the pump radiation and to provide the pump radiation at the interactive region. Optionally, the gas flow 615 is provided by the gas delivery system into an evacuated or nearly evacuated space. The gas delivery system may comprise a gas nozzle 609, as shown in FIG. 6, which comprises an opening 617 in an exit plane of the gas nozzle 609. The gas flow 615 is provided from the opening 617. In almost all the prior arts, the gas nozzle has a cut tube geometry shape which is a uniform cylinder interior geometry shape, and the shape of the opening in the exit plane is round. An elongated opening has also been used as described in the patent application CN101515105B.

The dimensions of the gas nozzle 609 may conceivably also be used in scaled-up or scaled-down versions ranging from micrometer-sized nozzles to meter-sized nozzles. This wide range of dimensioning comes from the fact that the setup may be scaled such that the intensity of the pump radiation at the gas flow ends up in the particular range which may be beneficial for the emitted radiation, which requires different dimensioning for different pump radiation energies, which may be a pulse laser and pulse energies can vary from tens of microjoules to joules. Optionally, the gas nozzle 609 has a thicker wall to reduce nozzle deformation caused by the thermal expansion effect, which may be detected by e.g. a camera. The gas nozzle with thicker wall may produce a stable gas volume with reduced variation. Optionally, the illumination source comprises a gas catcher which is close to the gas nozzle to maintain the pressure of the chamber 601.

Due to interaction of the pump radiation 611 with the gas atoms of the gas flow 615, the gas flow 615 will convert part of the pump radiation 611 into the emitted radiation 613, which may be an example of the emitted radiation 342 shown in FIG. 6. The central axes of the emitted radiation 613 may be collinear with the central axes of the incident pump radiation 611. The emitted radiation 613 may have a wavelength in X-ray or EUV range, wherein the wavelength is in a range from 0.01 nm to 100 nm, optionally from 0.1 nm to 100 nm, optionally from 1 nm to 100 nm, optionally from 1 nm to 50 nm, or optionally from 10 nm to 20 nm.

In operation the emitted radiation 613 beam may pass through a radiation output 607 and may be subsequently manipulated and directed by an illumination system 603, which may be an example of the illumination system 312 in FIG. 6, to a substrate to be inspected for metrology measurements. The emitted radiation 613 may be guided, optionally focused, to a structure on the substrate.

Gas target HHG configurations may be divided into two broad categories: gas jets and gas capillaries. The setup described in FIG. 6 and other figures throughout this description depict a gas jet-based gas delivery system providing a gas flow via gas nozzle 609. However, the features described in this disclosure may also be provided in an illumination source having a gas capillary-based gas delivery system.

In a gas capillary configuration, the capillary structure may be configured to comprise gas inside the capillaries, and to receive and guide pump radiation. The dimensions of the capillary structure holding the gas may be small in a lateral direction such that it significantly influences the propagation of the pump radiation laser beam. The interaction region where emitted radiation is generated through HHG may be located inside the capillary structure. The gas target may be located inside the capillary structure. The capillary structure may for example be a hollow core fibre, such as a hollow core photonic crystal fibre.

Once generated, the emitted radiation may propagate through the gas capillary structure. The propagation direction of the pump radiation and the emitted radiation may be substantially the same as they exit the capillary structure. Therefore, next to the capillary structure, the illumination source may comprise further optical elements for separating the pump radiation and the generated emitted radiation. These structures may comprise optical elements configured to diffract pump radiation away from one or more main propagation directions of the emitted radiation.

Because air (and in fact any gas) heavily absorbs SXR or EUV radiation, the volume between the gas flow 615 and the wafer to be inspected may be evacuated or nearly evacuated. Since the central axes of the emitted radiation 613 may be collinear with the central axes of the incident pump radiation 611, the pump radiation 611 may need to be blocked to prevent it passing through the radiation output 607 and entering the illumination system 603. This may be done by incorporating a filtering device 344 shown in FIG. 6 into the radiation output 607, which is placed in the emitted beam path and that is opaque or nearly opaque to the pump radiation (e.g. opaque or nearly opaque to infrared or visible light) but at least partially transparent to the emitted radiation beam. The filter may be manufactured using zirconium or multiple materials combined in multiple layers. The filter may be a hollow, optionally an annular, block when the pump radiation 611 has a hollow, optionally an annular, transversal cross-sectional profile. Optionally, the filter is non-perpendicular and non-parallel to propagation direction of the emitted radiation beam to have efficient pump radiation filtering. Optionally, the filtering device 344 comprise a hollow block and a thin membrane filter such as an Aluminum (Al) or Zirconium (Zr) membrane filter. Optionally, the filtering device 344 may also comprise mirrors that efficiently reflect the emitted radiation but poorly reflect the pump radiation, or comprise a wire mesh that efficiently transmits the emitted radiation but poorly transmits the pump radiation.

Described herein are methods, apparatuses, and assemblies to obtain emitted radiation optionally at a high harmonic frequency of pump radiation. The radiation generated through the process, optionally the HHG which uses non-linear effects to generate radiation optionally at a harmonic frequency of provided pump radiation, may be provided as radiation in metrology tools MT for inspection and/or measurement of substrates. If the pump radiation comprises short pulses (i.e. few-cycle) then the generated radiation is not necessarily exactly at harmonics of the pump radiation frequency. The substrates may be lithographically patterned substrates. The radiation obtained through the process may also be provided in a lithographic apparatus LA, and/or a lithographic cell LC. The pump radiation may be pulsed radiation, which may provide high peak intensities for short bursts of time.

The pump radiation 611 may comprise radiation with one or more wavelengths higher than the one or more wavelengths of the emitted radiation. The pump radiation may comprise infrared radiation. The pump radiation may comprise radiation with wavelength(s) in the range of 800 nm to 1500 nm. The pump radiation may comprise radiation with wavelength(s) in the range of 900 nm to 1300 nm. The pump radiation may comprise radiation with wavelength(s) in the range of 100 nm to 1300 nm. The pump radiation may be pulsed radiation. Pulsed pump radiation may comprise pulses with a duration between 1 fs and 100 fs.

For some embodiments, the emitted radiation, optionally the high harmonic radiation, may comprise one or more harmonics of the pump radiation wavelength(s). The emitted radiation may comprise wavelengths in the extreme ultraviolet (EUV), soft X-Ray (SXR), and/or hard X-Ray (HXR) part of the electromagnetic spectrum. The emitted radiation 613 may comprise wavelengths in the range of 0.01 nm to 100 nm. The emitted radiation 613 may comprise wavelengths in the range of 0.1 nm to 100 nm. The emitted radiation 613 may comprise wavelengths in the range of 0.1 nm to 50 nm. The emitted radiation 613 may comprise wavelengths in the range of 1 nm to 50 nm. The emitted radiation 613 may comprise wavelengths in the range of 10 nm to 20 nm.

Radiation, such as high harmonic radiation described above, may be provided as source radiation in a metrology tool MT. The metrology tool MT may use the source radiation to perform measurements on a substrate exposed by a lithographic apparatus. The measurements may be for determining one or more parameters of a structure on the substrate. Using radiation at shorter wavelengths, for example at EUV, SXR and/or HXR wavelengths as comprised in the wavelength ranges described above, may allow for smaller features of a structure to be resolved by the metrology tool, compared to using longer wavelengths (e.g. visible radiation, infrared radiation). Radiation with shorter wavelengths, such as EUV, SXR and/or HXR radiation, may also penetrate deeper into a material such as a patterned substrate, meaning that metrology of deeper layers on the substrate is possible. These deeper layers may not be accessible by radiation with longer wavelengths.

In a metrology tool MT, source radiation may be emitted from a radiation source and directed onto a target structure (or other structure) on a substrate. The source radiation may comprise EUV, SXR and/or HXR radiation. The target structure may reflect, transmit and/or diffract the source radiation incident on the target structure. The metrology tool MT may comprise one or more sensors for detecting diffracted radiation. For example, a metrology tool MT may comprise detectors for detecting the positive (+1st) and negative (−1st) first diffraction orders. The metrology tool MT may also measure the specular reflected or transmitted radiation (0th order diffracted radiation). Further sensors for metrology may be present in the metrology tool MT, for example to measure further diffraction orders (e.g. higher diffraction orders).

Optionally the gas target in HHG source may consist of a relatively small volume of gas comparable in size to a focal region of the pump radiation, where the pump radiation is focused to have a power density above a certain value. In one embodiment, the opening in the exit plane is of a slit shape with long axis of the slit oriented along the propagation direction of the pump radiation, and the gas target is of a few tens of μm in the directions perpendicular to the propagation direction of the pump radiation, and a few hundreds of μm in the propagation direction of the pump radiation. The size of the gas target may be designed depending on the focal region size of the pump radiation.

In the direction perpendicular to the propagation direction of the pump radiation and perpendicular to the flow direction of the gas flow, accurate alignment is important to make sure the pump radiation is focused on the gas target at or close to the center, otherwise parts of the pump radiation will miss the high-density region at the center, leading to poor CE and asymmetric (i.e. poor quality) emitted radiation.

In the flow direction of the gas flow, accurate alignment that is close to, but not hitting, the nozzle is crucial to get a specific profile of the gas flow and high density without damaging the nozzle. In one embodiment, the gas density of the gas flow first increases to a maximum value and subsequently falls sharply in a cut-off region along the propagation direction. More information about the profile of the gas flow is described in patent application NL2024462A incorporated herein by reference in its entirety. Heat induced nozzle length variations may be a source of instability in HHG source, so if the distance between the nozzle and the focal region of the pump radiation can be kept constant, the source stability may be significantly improved.

In the propagation direction of the pump radiation, accurate position alignment is important because both the CE and emitted beam divergence are very sensitive to the position of the gas target with respect to the focal region of the pump radiation. Furthermore, it is desirable to be able to measure the position of the interaction region because when the emitted radiation illuminates on the substrate the illumination system, optionally focusing optics, of the emitted radiation are sensitive to the position.

In HHG source, a precise pump radiation to gas target alignment is crucial for achieving a high conversion efficiency (CE) and high beam quality of the emitted radiation e.g. EUV and/or SXR. Meanwhile the gas target needs to have a small size, optionally similar to the interaction region, in order to limit plasma defocusing, vacuum contamination and/or gas consumption.

Due to drifts in the radiation source (such as heating of optics, vibrations, etc), both the focal region of the pump radiation and the gas target may shift during operation, which may contribute to CE or emitted radiation beam profile drifts and/or variations, source position variation and/or SXR beam pointing variation, leading to variations in the position and quality of the projected emitted radiation spot on the wafer target.

In the HHG sources, the amount of emitted radiation by a single atom in the gas target is extremely small. Consequently, it is important to optimize HHG sources so that they output sufficient power with an acceptable beam quality to enable e.g. SXR-based integrated circuit technology (ICT) metrology tool. The optimization is challenging due to many parameters involved in the complex physics, as well as the lack of direct and quantitative measurements of the HHG interaction process.

A significant complication generic to HHG source is that the gas target is partly ionized by the high-intensity pump radiation, thus a plasma is created. Lifetime of the plasma generated by a pump radiation pulse may be in nanosecond range. The adverse effect of this plasma is to deteriorate the intensity distribution of the pump radiation beam by a process called plasma defocusing, preventing peak intensity needed for optimal emitted radiation, e.g. SXR and/or EUV, emission and preventing the intensity distribution needed for optimal beam quality of the emitted radiation. More information about the plasma defocusing is described in patent application NL2024462A incorporated herein by reference in its entirety.

In-line quantitative measurements of the generated plasma during the HHG is highly needed. Because that the plasma is a direct output of the interaction between the pump radiation and the gas target, measuring and monitoring the position of the plasma shows directly how the pump radiation is aligned in respect to the gas target. The shape of the plasma distribution may give feedback on the HHG process, which may be used to keep the conditions optimal for the emitted radiation output.

Figure 8:
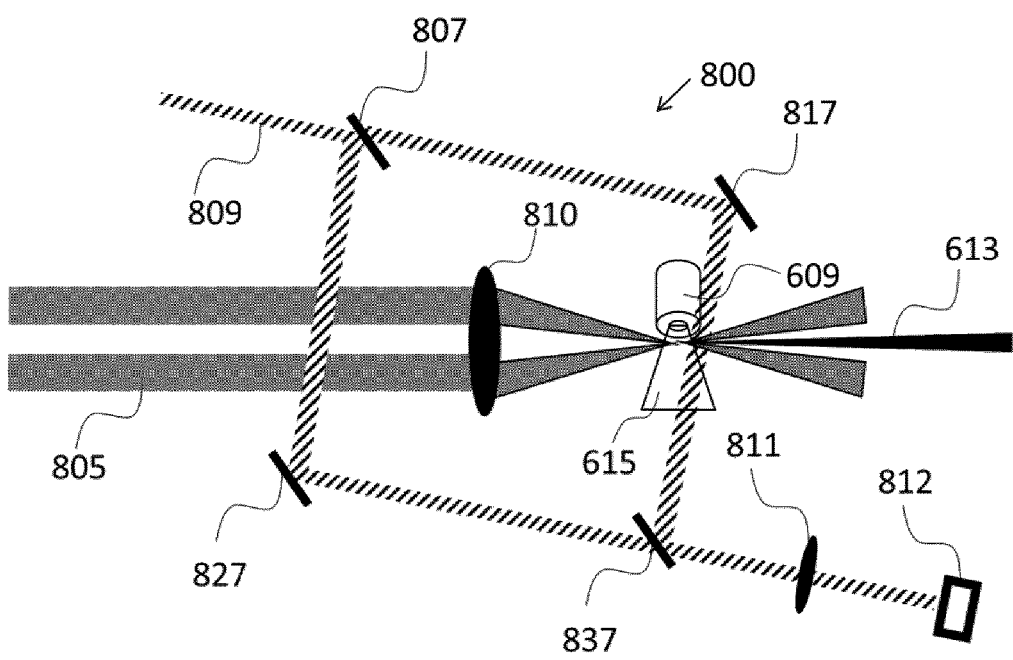
FIG. 8 depicts a schematic representation of an illumination source with an interferometer.

FIG. 8 depicts a schematic representation of an illumination source 800 with an interferometer. One or more of the features of the illumination source in the metrology tool described with respect to FIG. 6 and FIG. 7 may also be present in the illumination source 800 as appropriate. The pump radiation 805 illuminates on the gas target 615 to generate the emitted radiation 613. Optionally the pump radiation 805 has a hollow, for example annular, transversal cross-sectional profile in order to separate the pump radiation 805 and the emitted radiation 613. More information about the hollow transversal cross-sectional profile is described in patent applications WO2019219336A1 and WO2020038648A1 incorporated herein by reference in their entireties. Optionally the illumination source 800 comprises a focus element 810, e.g. a focus lens, to focus the pump radiation 805 to the focal region, optionally into the interaction region of the gas target 615. Optionally the pump radiation 805 may be manipulated by a beam shaper. Optionally the beam shaper is upstream of the focus element 810. Examples of the beam shaper include a spatial light modulator (SLM), a flattop beam shaper and a deformable mirror.

The interferometer in the illumination source 800 is for illuminating at least part of the gas target 615 with an interferometer radiation 809 to measure a property of the gas target 615. Note that a property of the generated plasma is also considered as a property of the gas target 615. The interferometer may comprise one or more of optical elements 807, 817, 827, 837 and a detection element 812. In the embodiment shown in FIG. 8 and FIG. 9, the optical elements 807 and 837 are beam splitters while the optical elements 817 and 827 are mirrors. The interferometer radiation is split by the beam splitter 807 into two branches that may travel in different optical paths, which are then combined by the second beam splitter 837 to produce interference. The detection element 812, e.g. a camera, is to detect an interferometer signal, which is described in later text. Optionally the interferometer may comprise an optical element 811, which may be an imaging lens, upstream of the detection element 812. In one embodiment, the interferometer radiation comprises two branches, one of which at least partly passes through the gas target 615, while the other does not pass through the gas target 615. The two branches are combined downstream and interfere to generate the interferometer signal on the detection element 812. Optionally, the branch that passes through the gas target 615 at least partly illuminates on at least part of the gas nozzle. Optionally the interferometer comprises an adjustable element, for example a movable mirror, for altering a propagation direction of the interferometer radiation. For example, the propagation direction of the branch that passes through the gas target 615 may be altered to enable illuminating the gas target 615 under various angles. The properties of the gas target 615 may also be calculated via an algorithm. The branch that passes through the gas target 615 may be partially cut by the edge of the gas nozzle and the gas nozzle may be imaged onto the camera optionally for alignment measurement.

The interferometer radiation 809 has an interferometer wavelength, and the pump radiation 805 has a pump wavelength. In one embodiment, the interferometer wavelength and the pump wavelength are different, which may be the easiest and preferred design to work with, because the pump radiation 805 can be filtered out from the detected interferometer signal in a straightforward way.

In a second embodiment, the interferometer wavelength and the pump wavelength are the same while the polarizations of the interferometer radiation 809 and the pump radiation are different, which allows the pump radiation 805 to be filtered out from the interferometer signal using e.g. polarizing filter. During operation, part of the interferometer radiation 809 may pass through the gas target 615 with noble gas, which may be regarded as an isotropic medium. The isotropic medium may not change the polarization of the interferometer radiation 809. Therefore the pump radiation 805 can be discriminated from interferometer radiation 809 by polarization isolation.

Pulsed pump radiation may be necessary for HHG process, while the interferometer radiation may be either pulsed or continuous. In the continuous case, a time-averaged state of the gas target may be measured. One example is that the repetition rate of the pump radiation is so high that the effect of the previous pulse has not decayed before arrival of the next pulse. In this case, one may monitor the slowly evolving gas state using a continuous interferometer radiation.

Under most conditions, the pump radiation may comprise short pulses separated by larger intervals, the fraction of time that the pump radiation interacts with the gas target is small and pulsed interferometer radiation may be preferred. Optionally the interferometer radiation, similar as the pump radiation, may comprise pulses with a duration, for example, in the femtosecond range. As mentioned above, the lifetime of a plasma generated by a pump radiation pulse may be in nanosecond range. Therefore it may be challenging to measure the profile of the plasma if the time when the pump radiation pulse and the interferometer radiation pulse arrive at the gas target 615 is not accurately controlled.

Figure 9:
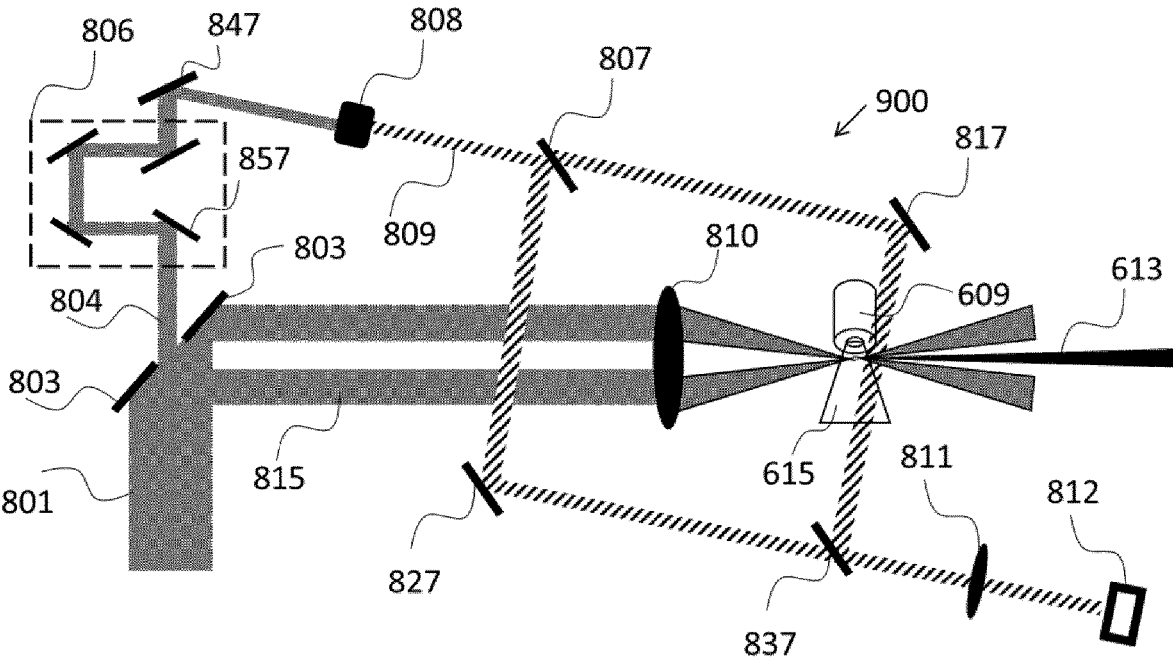
FIG. 9 depicts one embodiment of a schematic representation of an illumination source with an interferometer.

The illumination source 800 may comprise a time delay unit 806 as shown in FIG. 9, comprising one or more mirrors 857 for changing a time difference optionally between the arrivals of the pulses of the interferometer radiation and the pump radiation at the gas target. Other appropriate means to delay pulses of radiation can be used in the time delay unit 806 as well, such as for example using transparent wedges that induce a time delay the scaled with the pathlength of the pulses through the transparent wedges.

In the pulsed interferometer case, the time during which an interferometer pulse passes through the gas target defines a time window when the state of the gas target may be measured. During a time window before arrival of a pump pulse, the detector 812 may record the pristine state of the gas target without interaction. During passage of a pump pulse, the detector 812 may record part of period when the plasma is generated. After passage of the pump pulse, the detector 812 may record a total effect of the pump pulse on the state of the gas target. A time resolution shorter than the interferometer pulse length may be obtained by comparing an interferometry result with other results with different timing.

Therefore synchronization may be necessary to make sure that the interferometer radiation pulse and the pump radiation pulse have equal repetition rate, or the same frequency. The pulses of the interferometer radiation 809 and the pump radiation 805 are at least partly synchronized. The definition of synchronization may also be expended to that the interferometer radiation pulse repetition rate is of integer multiple of the pump radiation pulse repetition rate, in which case that the plasma generated by one pump radiation pulse may be measured by more than one interferometer radiation pulses. One the other hand, it is possible that only one out of multiple plasmas generated by multiple pump radiation pulses may be measured by one interferometer radiation pulses, and the definition of synchronization may also be expended to that the pump radiation pulse repetition rate is of integer multiple of the interferometer radiation pulse repetition rate.

Time control using a time delay unit is also important for accurate measurement, which is controlling arrival time of the interferometer radiation pulse w.r.t. arrival time of the pump radiation pulse, optionally on the femtosecond level.

An example of time control may be that temporal positions of pulses are adjusted such that the pulses from two sources temporally coincide, optionally in the gas target 615. In this application, time control may also include the situation that the pulses from two sources have a fixed time delay or a controlled varying time delay. In one embodiment, the interferometer pulses measure only once for multiple pump radiation pulses in a time-controlled way, or there are multiple interferometer pulses to measure a single pump radiation pulse in a time-controlled way.

In many cases one may also choose a setting in which both pulses partially overlap in the gas target, but it is not limited to that because one may also be interested in timing the interferometer radiation pulse before or after the pump radiation pulse, without overlap in the gas target.

From interference fringes on the detection element 812 generated by interference of the two branches, one may calculate a phase shift introduced by the gas and/or the plasma. When a plasma is generated by the high-intensity HHG source pump radiation 815, the phase shift introduced by both the gas and the plasma may be measured. When the HHG source pump radiation 815 is blocked by a removable beam block or has an intensity which is low enough that no plasma is generated, the phase shift introduced only by the gas may be measured. For the embodiments in which the pump radiation and interferometer pump radiation are produced by different sources, the pump radiation source may be switched off to measure the phase shift introduced only by the gas. The phase shift introduced only by the plasma may be extracted by subtracting the gas-introduced contribution from the both-introduced contribution.

The plasma induced phase shift $\varphi$ is linked to a plasma density by the following equation:

$$\varphi = \int_0^L G_e N_e dl$$

where $G_e$ and $N_e$ are electron Gladstone constant and electron number density respectively, and $l$ is the path length of the interferometer radiation through the gas target. Therefore one can derive the phase shift $\varphi$ which is line integral of the plasma density along the propagation direction of the branch that passes through the gas target.

By setting proper time delay between the interferometer pump radiation 804 and the pump radiation 805, a final state of the plasma may be measured after the HHG source pump radiation pulse has passed. At the final state, the strongest signal is expected, which is good for alignment.

How the plasma is built up during passage of the pump radiation pulse through the gas target may also be measured by scanning the time delay of the interferometer radiation pulse, such that the time of arrival of the interferometer pulse at the gas target varies between the start of the passage of the pump radiation pulse through the gas target and the end of this passage. This measurement may be useful to study, understand and optimize the HHG process. One may also measure how fast the plasma decays after passage of the pump radiation pulse trough the gas target by scanning the time delay of the interferometer pulse, such that the time of arrival of the interferometer pulse at the gas target varies between the end of the passage of the pump radiation pulse through the gas target and the end of the plasma decay.

In one embodiment, the illumination source 800 may comprise a feedback loop to control a property of the pump radiation or the gas delivery system based on the property of the gas target, optionally based on the property of the plasma. In another embodiment, the illumination source may comprise a feedforward loop to control downstream elements in a feedforward way, such as adjusting one or more optical elements of the illuminator that compensate for position variations of the gas target observed by the interferometer.

For example there may be a visual feedback on where the pump radiation 805 is with respect to the gas target 615, so that the alignment may be precisely tuned, and also the absolute position of the pump radiation 805 in the gas target 615, which is the position of the plasma, can be measured. During operation, optimal alignment may be kept despite system drifts or fluctuations by means of a feedback loop.

Optimal emitted radiation 613 is a sensitive balance between sufficient intensity, pressure and too much ionization. This balance may be improved and stabilized by observing e.g. the level of ionization and the shape of the pump radiation 805. This invention may be helpful in both finding optimal conditions during setup and keeping the HHG dynamics constant during operation.

In addition, this invention also allows for in-line target gas density and profile monitoring. Given the fact that the nozzle is very close to the high intensity region and exposed to the plasma, monitoring the possible degradation of the nozzle is important.

FIG. 9 depicts a schematic representation of one embodiment 900 of the illumination source 800 with an interferometer shown in FIG. 8. In this embodiment, the interferometer radiation 809 is a second or higher harmonic of an interferometer pump radiation 804 generated by a harmonic generation process. An interferometer target 808, or called harmonic conversion unit, which may be a non-linear crystal or a gas target, is illuminated by the interferometer pump radiation 804. When the interferometer radiation is a second harmonic of the interferometer pump radiation 804 generated by the harmonic generation process, the interferometer target 808 may be a solid, for example a barium borate (BBO) crystal. When the interferometer radiation is a third or higher harmonic of the interferometer pump radiation 804 generated by the harmonic generation process, the interferometer target 808 may be a non-linear crystal, or similar to the gas target 615 described above. Optionally there is a focusing element 847 upstream of the interferometer target 808 to focus the interferometer pump radiation 804 tot the interferometer target 808.

The illumination source 900 may comprise the time delay unit 806 comprising one or more mirrors 857 for changing a time difference optionally between the arrivals of the pulses of the interferometer radiation and the pump radiation at the gas target. The time delay unit 806 may be placed upstream of the focusing element 847, as shown in FIG. 9. The time delay unit 806 may also be placed in between the interferometer target 808 and the optical element 807.

In the embodiment 900, an HHG source pump radiation 815, which has similar characteristics as the pump radiation 805, may be an embodiment of the pump radiation 805 in FIG. 8. The interferometer pump radiation 804 and the HHG source pump radiation 815 are from the same pump radiation source, for example, they are split from a radiation 801 as shown in FIG. 9. In this way, the pulses have the same repetition rate. One way to split the radiation source 801 into two is using a reflective surface with a pinhole 803. Optionally in operation the interferometer pump radiation 804 passes through the pinhole and the HHG source pump radiation 815 is reflected by the reflective surface. Another example is using a beam splitter or anything else which can split the radiation 801.

In another embodiment, the interferometer pump radiation 804 and the HHG source pump radiation 815 are from different pump radiation sources, e.g. from two different laser sources, optionally with different wavelengths. The source that generates interferometer pump radiation 804 may be at least partly synchronized with the source of the HHG source pump radiation 815.

The first advantage of using a second or higher harmonic of the interferometer pump radiation 804 as the interferometer radiation 809, as shown in FIG. 9, is that the synchronization and time control between the interferometer radiation 809 and the HHG source pump radiation 815 may be easily achieved. The second advantage is that the interferometer radiation 809 and the HHG source pump radiation 815 will have different wavelengths, which makes the HHG source pump radiation 815 be easily filtered out from the detected interferometer signal.

In operation, power of the interferometer pump radiation may be at least one order lower than power of the pump radiation. For example, when the interferometer pump radiation 804 and the HHG source pump radiation 815 are split from a radiation source 801, the power of the interferometer pump radiation 804 is at the expense of the HHG source pump radiation 815, which may result in a lower emitted radiation power.

Figures 10, 11, 12, 13, 14:
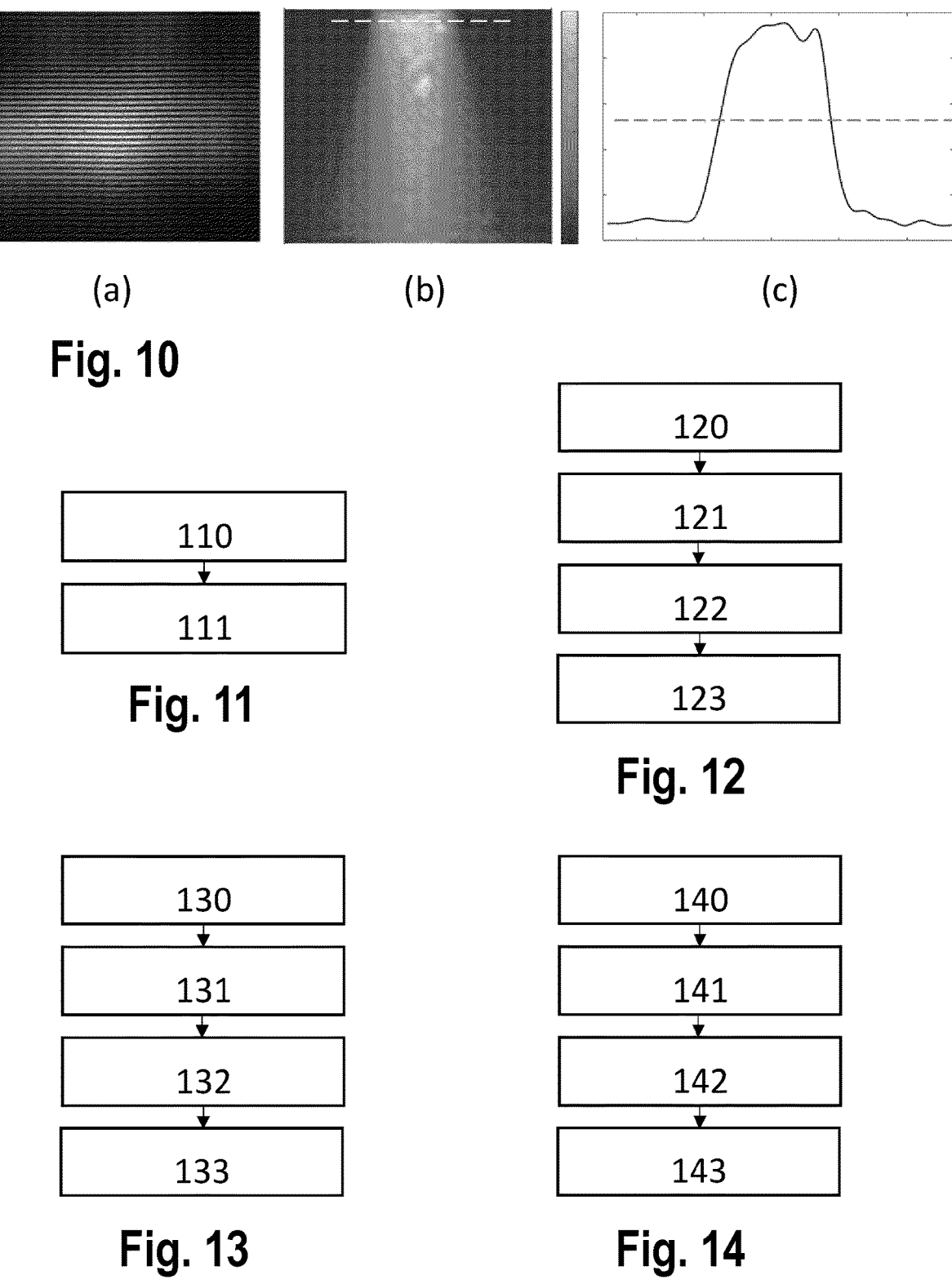
FIG. 10 depicts (a) fringes, (b) extracted phase and (c) density distribution.
FIG. 11 comprises a flow diagram of steps in a method of inspecting a gas target of an illumination source.
FIG. 12 comprises a flow diagram of steps in a method of aligning a pump radiation with respect to a gas target.
FIG. 13 comprises a flow diagram of steps in a method of optimizing an emitted radiation output.
FIG. 14 comprises a flow diagram of steps in a method of monitoring a plasma evolution over time.

FIG. 10 shown experimental results with a Neon gas target density, a slit nozzle and a Mach-Zehnder interferometer. FIG. 10(*a*) shows recorded fringes by the detection element 812 and FIG. 10(*b*) shows phase shift extracted from the recorded fringes in FIG. 10(*a*). In FIG. 10(*b*) the horizontal and vertical axis are positions along the propagation direction of the pump radiation and along the flow direction of the gas flow respectively. A classical fast Fourier transform (FFT) method may be used to extract the phase shift from the fringe patterns. First, a 2D FFT is conducted on the fringes to obtain the spectral map. Due to the dense initial fringes introduced by the small angle between mirrors, it may result in the two spectral peaks symmetric over the frequency axis. Then one of the peaks is selected and shifted to the origin of the frequency axis while the other spectral peak is removed. Finally, by an inverse FFT one can extract the phase associated with the fringes. More details of this method is given in the scientific journal "Fourier-transform method of fringe-pattern analysis for computer-based topography and interferometry" J. Opt. Soc. Am. Vol. 72, Iss. 1, pp. 156, (1982) by Takeda et. al., which is incorporated herein by reference in its entirety.

FIG. 10(*c*) shows the density distribution along the propagation direction of the pump radiation in the interaction region which corresponds to the dash line in FIG. 10(*b*). The horizontal axis represents position along the propagation direction of the pump radiation while the vertical axis represents density values.

All the above-mentioned embodiments may be used in methods for inspecting a gas target of an illumination source, as depicted in FIG. 11. A first step 110 is providing a gas target 615 with a gas delivery system 332 for generating an emitted radiation 342 at an interaction region of the gas target 615. There may be a second step 111, which is illuminating at least part of the gas target 615 using an interferometer radiation 809 of an interferometer to measure a property of the gas target 615. More details on methods of for inspecting a gas target of an illumination source are provided in the description of the embodiments described in relation to figures and texts above.

All the above-mentioned embodiments may also be used in methods for aligning a pump radiation with respect to a gas target, as depicted in FIG. 12. A first step 120 is providing a gas target 615 with a gas delivery system 332. There may be a second step 121, which is illuminating at least part of the gas target 615 with an interferometer radiation 809 of an interferometer to measure a property of the gas target 615. There may be a third step 122, which is illuminating at least part of the gas target 615 with a pump radiation 611. There may be a fourth step 123, which is controlling a property of at least one of the gas delivery system, the pump radiation, downstream optics, and substrate positioning mechanics based on a property of the gas target measured by the interferometer. More details on methods of for inspecting a gas target of an illumination source are provided in the description of the embodiments described in relation to figures and texts above.

All the above-mentioned embodiments may also be used in methods for optimizing an emitted radiation output, as depicted in FIG. 13. A first step 130 is providing a gas target 615 with a gas delivery system 332. There may be a second step 131, which is illuminating at least part of the gas target 615 with an interferometer radiation 809 of an interferometer to measure a property of the gas target 615. There may be a third step 132, which is illuminating at least part of the gas target 615 with a pump radiation 611. There may be a fourth step 133, which is controlling a property of at least one of the gas delivery system, the pump radiation, downstream optics, and substrate positioning mechanics based on a property of the gas target measured by the interferometer. More details on methods of for inspecting a gas target of an illumination source are provided in the description of the embodiments described in relation to figures and texts above.

All the above-mentioned embodiments may also be used in methods for monitoring a plasma evolution over time, as depicted in FIG. 14. A first step 140 is providing a gas target 615 with a gas delivery system 332. There may be a second step 141, which is illuminating at least part of the gas target 615 with an interferometer radiation 809 of an interferometer to measure a property of the gas target 615. There may be a third step 142, which is illuminating at least part of the gas target 615 with a pump radiation 611 to initiate the plasma evolution in the gas target 615. There may be a fourth step 143, which is monitoring the plasma evolution over time based on a property of the gas target 615 measured by the interferometer. More details on methods of for inspecting a gas target of an illumination source are provided in the description of the embodiments described in relation to figures and texts above.

The illumination source described above may have a high running cost. This may in part be as a result of the use of expensive gases for providing the gas target and generating emitted radiation. Gases such as Neon, Xenon, or other gases for HHG radiation generation mentioned above, may be used in an illumination source with a flowrate in a range from 5-20 nl/min, in order to create a desired local density in a vacuum environment. Because of the relatively high cost of such gases, the gas flow may be switched off while the illumination source is idle, i.e. not in use. The HHG radiation may be generated in a vacuum environment (e.g. with a pressure of an order $<10^{-6}$ mbar) into which the gas is injected. The area in which the gas is present may therefore create a localised environment having higher pressures than its surrounding vacuum (e.g. with a pressure of an order around $\sim10^{-2}$ mbar).

However, this switching off of the gas flow may result in significantly different conditions inside the illumination source during a first "on" state, and a second "idle" state. Turning the gas flow on and off between the on and idle states, may result in a localised pressure variation (e.g. a pressure variation in a range from $<10^{-6}$ mbar to $\sim10^{-2}$ mbar). This variation in pressure may also lead to a difference in convective cooling of the area. The difference in convective cooling may be significant, e.g. up to four orders of magnitude. As a result of this difference, thermal mechanical instabilities due to temperature differences may occur. This may result in misalignment of the focussing beam, instability of conversion efficiency CE.

Figures 15A, 15B, 15C:
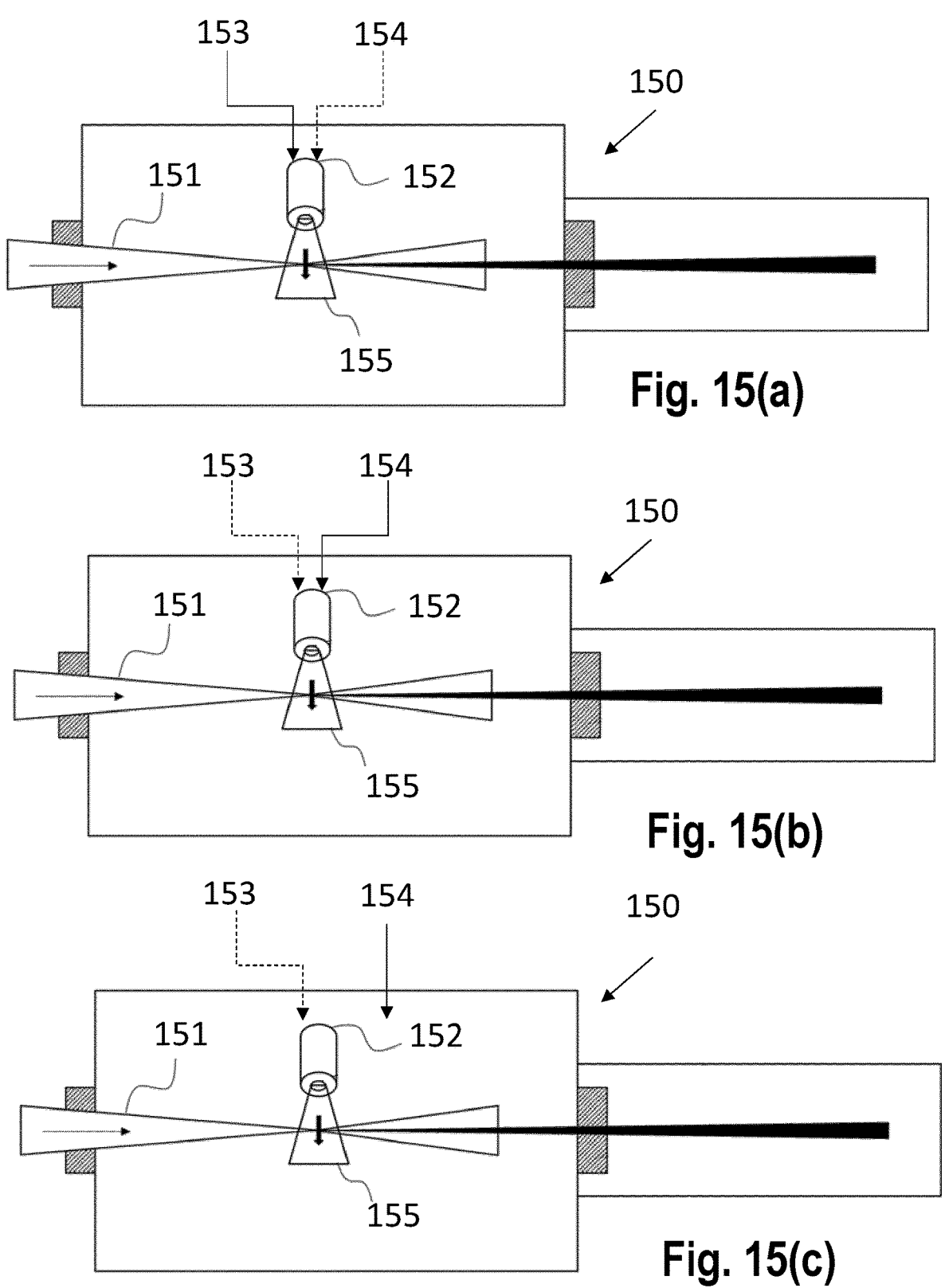
FIGS. 15(*a*), 15(*b*) and 15(*c*) depict an illumination source comprising a gas delivery system configures to provide a first state and a second state.

In order to avoid the issues caused by pressure variation, it may be desirable to maintain a gas pressure by introducing a gas flow while the illumination source is idle. In order to save cost and resources, it is proposed to provide a second gas while the illumination source is idle. FIGS. 15(a), 15(b), and 15(c) depict an illumination source 150 comprising a gas delivery system configured to provide a first state 15(a) and second state 15(b) or 15(c). Pump radiation 151 is received inside a chamber inside which HHG radiation, as described for example in relation to FIG. 6 above. In the first state depicted in FIG. 15(a), which may also be referred to as the "on" state, the gas delivery system 152 is configured to provide a first state comprising a first gas 153 for forming a gas target for generating emitted radiation. The emitted radiation may be generated inside the gas flow 155 comprising the first gas inside the interaction region where the pump radiation interacts with the first gas. This may be inside a gas jet produced by a gas nozzle, and/or in inside a capillary structure comprising the gas.

In FIGS. 15(b) and 15(c), a second state is provided by the gas delivery system 152, which may also be referred to as an idle state. The second state may comprise a second gas 154. In FIG. 15(b) the second gas is delivered by the same supply line as the first gas for the first state. In FIG. 15(c) the second gas of the second state is delivered via a separate supply line. The separate supply line may inject the second gas directly into the compartment/chamber, separate from a gas nozzle or other delivery system targeting the delivery of gas to the interaction region. The properties of the second state may be selected such that the heat transfer coefficient of the second state matches the heat transfer coefficient of the first state. The matching of heat transfer coefficients may be achieved in some or all of the areas of the illumination source 150 where the first has is present during the first stage. The area may include the interaction region where HHG radiation is generated. Although not specifically mentioned, the gas delivery system with first and second states and gases optionally can be provided in combination with any of the embodiments described herein.

An advantage of using the first and second on and idle states may be cheaper operational costs, especially while the illumination source is idle, while avoiding negative effects caused by a change in temperature resulting from heat transfer coefficient variation of the environment in and around the interaction region where the first gas is present (e.g. alignment, CE stability). The use of an idle state to match heat transfer coefficient conditions of an active "on" state may lead to a more stable temperature and setup in the illumination source. Another advantage may be increased throughput and/or efficiency, as a result of the reduction of temperature variation and resulting negative effects. Another advantage may be improved performance of the radiation source as there may be less radiation out of target.

As mentioned above, the first gas may be any gas used for generation of the emitted radiation, such as for example Neon, or Xenon. The second gas may comprise a gas that is cheaper than the first gas, for example nitrogen, argon, and/or other gases. In some embodiments, the first gas and the second gas may be provided in the same supply line of the gas delivery system. In an example setup where the first gas comprises neon and the second gas comprises nitrogen (or other suitable gas), the nitrogen may be provided through the same supply line, when the neon gas flow is turned off while the illumination source is idle. When the same supply line is used, a high nitrogen flow and pressure may be required.

In some embodiments, the second "idle" gas may comprise a mixture of gases. The mixture of gases may comprise oxygen. The mixture may for example be a mixture of oxygen and nitrogen. In some examples, ultraclean, filtered air may be used. An advantage of providing oxygen is that the oxygen may clean the optics inside the chamber by reacting with and removing carbon built up on the optics during operation of the source. In order for the oxygen to perform cleaning of optics inside the chamber, UV radiation may be provided inside the chamber to interact with the oxygen during the idle state. The UV radiation may comprise radiation at one or more wavelengths below 240 nm. Preferably, the UV radiation comprises radiation at a wavelength of approximately 185 nm. The UV radiation may be provided by a source, for example by installing a mercury UV source for irradiating the chamber.

The UV radiation may convert some of the oxygen into ozone, which may react with carbon contamination inside the chamber to form volatile products. These may then be removed from the chamber by being pumped away. The cleaning process may be performed inside the chamber for several hours, for example 2 or more hours. If the idle state of the illumination source lasts longer than the cleaning process, the cleaning process may be paused, for example be turning off the UV radiation, and/or by removing oxygen from the gas flow mixture.

In some embodiments, the gas delivery system may comprise two supply lines, for the first gas, and second gas respectively. The second supply line (e.g. using nitrogen) for the second state may be turned on when the first supply line (e.g. using neon) for the first state is turned off. This separate nitrogen supply line may need a lower nitrogen flow and pressure compared to the setup using a single supply line for both the first and second gases.

When using separate supply lines, they may in some examples provide the same gas, wherein the gas flow and pressure of the first state are significantly higher than the gas flow and pressure of the second state. This may still lead to a lower operational cost and resource consumption during the idle, second, state of the gas delivery system, as a result of the lower gas flow and pressure required when using the second supply line. In some examples, the second gas may comprise recycled first gas, that is to say, using first gas that has already been used in the source in the first state and/or second state. This may further reduce consumption of gas resources.

In some examples, during the second state, a gate valve may be closed inside the illumination source for lowering the pump capacity. The gate valve may be located in front of a turbo molecular pump (TMP) of the source. This valve closure, or partial closure, may lower the capacity of the pump during an idle state of the illumination source, which may result in creating a condition so that a lower gas supply may be needed to meet the pressure and heat transfer coefficient requirements.

The two state on/idle gas delivery system described herein may be used on combination with an interferometer setup for measuring a property of the gas target. However the effect of the gas delivery system providing gas in an idle state of the source that matches a heat transfer coefficients of the gas in an on state of the source can work independently of features such as an interferometer setup as described herein. Therefore, the two-state gas delivery system can function and may be provided separately from the interferometer setup, or any optional features of the illumination source described herein.

The order of the steps of the methods mentioned above may be different and the steps may be executed in parallel. The above-mentioned method may also be applied in a feedback loop, for example, in FIG. 12, the step 123 may be looped back to the step 120.

The illumination source may be provided in for example a metrology apparatus MT, an inspection apparatus, a lithographic apparatus LA, and/or a lithographic cell LC.

The properties of the emitted radiation used to perform a measurement may affect the quality of the obtained measurement. For example, the shape and size of a transverse beam profile (cross-section) of the radiation beam, the intensity of the radiation, the power spectral density of the radiation etc., may affect the measurement performed by the radiation. It is therefore beneficial to have a source providing radiation that has properties resulting in high quality measurements.

Further embodiments are disclosed in the subsequent numbered clauses:

1. An illumination source comprising
   a gas delivery system being configured to provide a gas target for generating an emitted radiation at an interaction region of the gas target, and
   an interferometer for illuminating at least part of the gas target with an interferometer radiation to measure a property of the gas target.

2. An illumination source according to clause 1, wherein the illumination source being configured to receive a pump radiation and to provide the pump radiation at the interactive region.

3. An illumination source according to clause 2, wherein the interferometer radiation has an interferometer wavelength, and the pump radiation has a pump wavelength, wherein the interferometer wavelength and the pump wavelength are different.

4. An illumination source according to clause 2 or 3, wherein the interferometer radiation and the pump radiation comprise pulses.

5. An illumination source according to clause 4, wherein the pulses of the interferometer radiation and the pump radiation are at least partly synchronized.

6. An illumination source according to any of clauses 4 or 5, wherein the illumination source comprises a time delay unit for adjusting a time delay between the pulses of the interferometer radiation and the pump radiation.

7. An illumination source according to any proceeding clause, wherein the interferometer radiation is a second or higher harmonic of an interferometer pump radiation generated by a harmonic generation process.

8. An illumination source according to clause 7, wherein the interferometer radiation is a second or third harmonic of the interferometer pump radiation generated by the harmonic generation process.

9. An illumination source according to clause 7 or 8 where referring to clause 2, wherein the interferometer pump radiation and the pump radiation are split from a radiation source.

10. An illumination source according to clause 9, wherein the illumination source comprises a reflective surface with a pinhole for splitting the interferometer pump radiation and the pump radiation.

11. An illumination source according to clause 10, wherein in operation the interferometer pump radiation passes through the pinhole and the pump radiation is reflected by the reflective surface.

12. An illumination source according to any of clauses 7 to 11 where referring to clause 2, wherein power of the interferometer pump radiation is at least one order lower than power of the pump radiation.

13. An illumination source according to any preceding clause, wherein the illumination source comprises a feedback loop or a feedforward loop based on a property of the gas target.

14. An illumination source according to clause 13 where referring to clause 2, wherein the illumination source comprises a feedback loop to control a property of at least one of the pump radiation, the gas delivery system, subsequent optics and substrate positioning mechanics based on the property of the gas target.

15. An illumination source according to any preceding clause, wherein the interferometer comprises two branches with a first branch radiation at least partly passing through the gas target and a second branch radiation not passing through the gas target, wherein the first branch radiation and the second branch radiation interfere.

16. An illumination source according to any preceding clause, wherein the gas delivery system comprises a gas nozzle and the interferometer radiation at least partly illuminates on at least part of the gas nozzle.

17. An illumination source according to any of clauses 1-15, wherein the interaction region is comprised within capillary structure.

18. An illumination source according to any preceding clause, wherein the interferometer comprises an adjustable element for altering a propagation direction of the interferometer radiation.

19. An illumination source comprising a gas delivery system configured to provide a first state and a second state; wherein the first state is configured to comprise a first gas forming a gas target for generating an emitted radiation at an interaction region of the gas target; and wherein the second state is configured to comprise a second gas during an idle state of the illumination source such that the heat transfer coefficient of the second state matches the heat transfer coefficient of the first state.

20. An illumination source according to clause 19, wherein the flowrate of the first gas is in a range from 5 to 20 nl/min.

21. An illumination source according to any of clauses 19-20, wherein the first gas comprises neon, or xenon.

22. An illumination source according to any of clauses 19-21, wherein the gas delivery system comprises separate supply lines configured to supply to the first gas and the second gas.

23. An illumination source according to any of clauses 19-22, wherein the second gas comprises nitrogen or argon.

24. An illumination source according to any of clauses 19-22, wherein the second gas comprises a gas mixture comprising oxygen.

25. An illumination source according to any of clauses 19-24, wherein the second gas comprises recycled first gas.

26. An illumination source according to any preceding clause, wherein the illumination source comprises a space that is configured to be evacuated and the gas delivery system is configured to provide the gas target in the space.

27. An illumination source according to any preceding clause, wherein the emitted radiation has a wavelength in X-ray or EUV range, wherein optionally the wavelength is in a range from 0.01 nm to 100 nm, optionally from 0.1 nm to 100 nm, optionally from 1 nm to 100 nm, optionally from 1 nm to 50 nm, or optionally from 10 nm to 20 nm.

28. A metrology apparatus comprising an illumination source according to any of clauses 1 to 27.

29. A metrology apparatus according to clause 28, wherein in operation the emitted radiation is guided to a structure on a substrate.

30. A lithographic cell comprising an illumination source according to any of clauses 1 to 27 or comprising a metrology apparatus according to clause 28 or 29.

31. A method of inspecting a gas target of an illumination source comprising
   providing a gas target with a gas delivery system for generating an emitted radiation at an interaction region of the gas target, and
   illuminating at least part of the gas target using an interferometer radiation of an interferometer to measure a property of the gas target.

32. A method according to clause 31, wherein the method comprising controlling a property of at least one of the gas delivery system, a pump radiation, subsequent optics, and substrate positioning mechanics based on the property of the gas target measured by the interferometer.

33. A method of aligning a pump radiation with respect to a gas target comprising the steps of providing the gas target with a gas delivery system,
   illuminating at least part of the gas target with an interferometer radiation of an interferometer to measure a property of the gas target,
   illuminating at least part of the gas target with a pump radiation, and
   controlling a property of at least one of the gas delivery system, the pump radiation, subsequent optics, and substrate positioning mechanics based on a property of the gas target measured by the interferometer.

34. A method of optimizing an emitted radiation output comprising the steps of
   providing a gas target with a gas delivery system,
   illuminating at least part of the gas target with an interferometer radiation of an interferometer to measure a property of the gas target,
   illuminating at least part of the gas target with a pump radiation, and
   controlling a property of at least one of the gas delivery system, the pump radiation, subsequent optics, and substrate positioning mechanics based on a property of the gas target measured by the interferometer.

35. A method of monitoring a plasma evolution over time comprising the steps of
   providing a gas target with a gas delivery system, illuminating at least part of the gas target with an interferometer radiation of an interferometer to measure a property of the gas target, illuminating at least part of the gas target with a pump radiation to initiate the plasma evolution in the gas target, and monitoring the plasma evolution over time based on a property of the gas target measured by the interferometer.

36. A method according to clause 35, wherein the method comprising controlling a property of at least one of the gas delivery system, the pump radiation, subsequent optics, and substrate positioning mechanics based on the property of the gas target measured by the interferometer.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments in the context of a lithographic apparatus, embodiments may be used in other apparatus. Embodiments may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Although specific reference may be made in this text to embodiments in the context of an inspection or metrology apparatus, embodiments may be used in other apparatus. Embodiments may form part of a mask inspection apparatus, a lithographic apparatus, or any apparatus that measures or processes an object such as a wafer (or other substrate) or mask (or other patterning device). The term "metrology apparatus" (or "inspection apparatus") may also refer to an inspection apparatus or an inspection system (or a metrology apparatus or a metrology system). E.g. the inspection apparatus that comprises an embodiment may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch of the metrology targets may be close to the resolution limit of the optical system of the scatterometer or may be smaller, but may be much larger than the dimension of typical non-target structures optionally product structures made by lithographic process in the target portions C. In practice the lines and/or spaces of the overlay gratings within the target structures may be made to include smaller structures similar in dimension to the non-target structures.

While specific embodiments have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference is made to HXR, SXR and EUV electromagnetic radiations, it will be appreciated that the invention, where the context allows, may be practiced with all electromagnetic radiations, includes radio waves, microwaves, infrared, (visible) light, ultraviolet, X-rays, and gamma rays.

The invention claimed is:

1. A method comprising:

providing a gas target using a gas delivery system;

illuminating at least part of the gas target with a pump radiation at an interaction region to generate a plasma and an emitted radiation;

illuminating at least part of the gas target with a first branch of a first radiation of an interferometer while a second branch of the first radiation does not pass through the gas target; and receiving the first and second branches of the first radiation at a detector of the interferometer to measure a property of the gas target comprising a property of the plasma;

wherein the first radiation has a first wavelength, the pump radiation has a pump wavelength, and the first wavelength and the pump wavelength are different.

2. The method of claim 1, wherein the first radiation is a second, third or higher harmonic of a second radiation generated by a harmonic generation process.

3. The method of claim 2, wherein the second radiation and the pump radiation are split from one radiation source.

4. The method of claim 1, wherein the illuminating with the first radiation comprises illuminating with pulses.

5. The method of claim 4, wherein the pump radiation comprises pulses, and the pulses of the first radiation and the pump radiation are at least partly synchronized.

6. The method of claim 5, further comprising using a time delay unit to adjust a time delay between the pulses of the first radiation and the pump radiation.

7. The method of claim 5, further comprising measuring a buildup of the plasma during the illuminating with the pump radiation by scanning a time delay of the pulses of the first radiation such that a time of arrival of each of the pulses of the first radiation at the gas target varies during the illuminating with the pump radiation.

8. The method of claim 5, further comprising measuring a decay of the plasma after the illuminating with the pump radiation by scanning a time delay of the pulses of the first radiation such that a time of arrival of each of the pulses of the first radiation at the gas target varies between a period defined by an end of the illuminating with the pump radiation and an end of the decay.

9. The method of claim 1, wherein the gas delivery system comprises a gas nozzle and the first branch of the first radiation at least partly illuminates at least part of the gas nozzle.

10. The method of claim 1, wherein the illuminating at least part of the gas target with the pump radiation comprises generating the emitted radiation as one or more harmonics of the pump wavelength.

11. The method of claim 1, wherein the interaction region is disposed within a capillary structure.

12. The method of claim 1, wherein the emitted radiation has a wavelength in a range from 0.01 nm to 100 nm.

13. The method of claim 1, wherein the receiving the first and second branches of the first radiation at the detector comprises measuring a phase shift introduced by the gas target and/or the plasma based on interference fringes generated by interference of the first and second branches of the first radiation.

14. The method of claim 1, wherein the receiving the first and second branches of the first radiation at the detector comprises measuring a position of the plasma as an indicator of an alignment of the pump radiation relative to the gas target.

15. The method of claim 1, further comprising measuring a plasma evolution over time based on the property of gas target and/or the property of the plasma measured by the detector of the interferometer.

16. The method of claim 15, further comprising measuring, with the detector, a state of the gas target before, during, and after the illuminating with the pump radiation to measure a state of the plasma.

17. An illumination source comprising:

a gas delivery system configured to provide a gas target at an interaction region;

a pump radiation source configured to illuminate at least part of the gas target with a pump radiation at the interaction region to generate a plasma and an emitted radiation; and an interferometer comprising a first branch of a first radiation configured to pass through at least part of the gas target and a second branch of the first radiation configured to not pass through the gas target;

wherein the first branch radiation and the second branch radiation interfere to measure a property of the gas target comprising a property of the plasma; and wherein the first radiation has a first wavelength, the pump radiation has a pump wavelength, and the first wavelength and the pump wavelength are different.

18. A metrology apparatus comprising:

an illumination source comprising:

a gas delivery system configured to provide a gas target at an interaction region;

a pump radiation source configured to illuminate at least part of the gas target with a pump radiation at the interaction region to generate a plasma and an emitted radiation; and an interferometer comprising a first branch of a first radiation configured to pass through at least part of the gas target and a second branch of the first radiation configured to not pass through the gas target;

wherein the first branch radiation and the second branch radiation interfere to measure a property of the gas target comprising a property of the plasma; and wherein the first radiation has a first wavelength, the pump radiation has a pump wavelength, and the first wavelength and the pump wavelength are different;

an illumination system configured to focus the emitted radiation toward a target disposed on a substrate support;

a detector configured to measure the emitted radiation reflecting from the target; and a processor configured to calculate a property of the target based on the measured radiation.

* * * * *